(12) United States Patent  
Liu et al.

(10) Patent No.: US 7,709,338 B2
(45) Date of Patent: May 4, 2010

(54) BICMOS DEVICES WITH A SELF-ALIGNED EMITTER AND METHODS OF FABRICATING SUCH BICMOS DEVICES

(75) Inventors: Qizhi Liu, Essex Junction, VT (US); Peter B. Gray, Essex Junction, VT (US); Alvin J. Joseph, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 728 days.

(21) Appl. No.: 11/614,757

(22) Filed: Dec. 21, 2006

(65) Prior Publication Data

US 2009/0020851 A1  Jan. 22, 2009

(51) Int. Cl.
*H01L 21/331* (2006.01)

(52) U.S. Cl. .................. 438/321; 438/312; 438/313; 438/320; 438/364

(58) Field of Classification Search ............ 438/312, 438/313, 320, 321, 364
See application file for complete search history.

(56) References Cited

U.S. PATENT DOCUMENTS

| | | | |
|---|---|---|---|
| 4,536,950 A * | 8/1985 | Sadamatsu et al. .......... 438/370 |
| 6,121,122 A | 9/2000 | Dunn et al. | |
| 6,448,124 B1 | 9/2002 | Coolbaugh et al. | |
| 6,597,050 B1 | 7/2003 | Dunn et al. | |
| 6,670,255 B2 | 12/2003 | Adkisson et al. | |
| 6,765,243 B1 * | 7/2004 | Kalburge et al. ............ 257/198 |
| 6,784,467 B1 * | 8/2004 | Kalburge et al. ............ 257/197 |
| 6,809,024 B1 | 10/2004 | Dunn et al. | |
| 6,888,221 B1 | 5/2005 | Joseph et al. | |
| 6,906,401 B2 | 6/2005 | Dunn et al. | |
| 6,909,164 B2 | 6/2005 | Gray et al. | |
| 6,911,681 B1 | 6/2005 | Geiss et al. | |
| 6,936,910 B2 | 8/2005 | Ellis-Monaghan et al. | |
| 6,965,133 B2 | 11/2005 | Geiss et al. | |
| 7,002,190 B1 | 2/2006 | Geiss et al. | |
| 7,038,298 B2 | 5/2006 | Joseph et al. | |
| 2001/0039095 A1 * | 11/2001 | Marty ........................ 438/321 |
| 2004/0222436 A1 | 11/2004 | Joseph et al. | |
| 2004/0222486 A1 | 11/2004 | Ellis-Monaghan et al. | |
| 2004/0222497 A1 | 11/2004 | Dunn et al. | |
| 2004/0224461 A1 | 11/2004 | Dunn et al. | |
| 2004/0262713 A1 | 12/2004 | Joseph et al. | |
| 2005/0199908 A1 | 9/2005 | Geiss et al. | |
| 2006/0017066 A1 | 1/2006 | Geiss et al. | |
| 2006/0060886 A1 | 3/2006 | Dunn et al. | |
| 2006/0060887 A1 | 3/2006 | Geiss et al. | |
| 2006/0124964 A1 | 6/2006 | Geiss et al. | |
| 2006/0157823 A1 | 7/2006 | Sheridan et al. | |
| 2006/0177986 A1 | 8/2006 | Joseph et al. | |
| 2007/0001264 A1 | 1/2007 | Sheridan et al. | |
| 2007/0051980 A1 | 3/2007 | Hodge et al. | |

* cited by examiner

*Primary Examiner*—Kevin M Picardat
*Assistant Examiner*—Bac H Au
(74) *Attorney, Agent, or Firm*—Wood, Herron & Evans, LLP

(57) ABSTRACT

A method of fabricating an heterojunction bipolar transistor (HBT) structure in a bipolar complementary metal-oxide-semiconductor (BiCMOS) process selectively thickens an oxide layer overlying a base region in areas that are not covered by a temporary emitter and spacers such that the temporary emitter can be removed and the base-emitter junction can be exposed without also completely removing the oxide overlying the areas of the base region that are not covered by the temporary emitter or spacers. As a result, a photomask is not required to remove the temporary emitter and to expose the base-emitter junction.

8 Claims, 4 Drawing Sheets

US 7,709,338 B2

BICMOS DEVICES WITH A SELF-ALIGNED EMITTER AND METHODS OF FABRICATING SUCH BICMOS DEVICES

FIELD OF THE INVENTION

The invention is generally directed to the fabrication of semiconductor devices, and in particular, to the fabrication of BICMOS devices.

BACKGROUND OF THE INVENTION

Heterojunction bipolar transistors (HBT's), e.g., as used in bipolar complementary metal-oxide-semiconductor (BiCMOS) processes, include an emitter formed as a pedestal over a planar base region (e.g., formed of silicon-germanium) that overlies a collector. The emitter is bounded on opposing sides by dielectric spacers, which overlay a portion of the base region. The base region directly under the junction with the emitter is typically referred to as an intrinsic base region, while the base region falling outside of the emitter and the spacers is referred to as an extrinsic base region, as the extrinsic base region is typically heavily doped via extrinsic doping to reduce the resistance between the base-emitter junction and the base contact. The region between the intrinsic and extrinsic regions is referred to as a link base region, and directly underlies the dielectric spacers. The length of each link base region must be carefully controlled to minimize resistance across the region while minimizing leakage currents due to the proximity of the heavily doped emitter to the heavily doped extrinsic base region. However, it has been found that the alignment of the various steps used to fabricate the various regions of the base region, the base-emitter junction, and the emitter can be difficult to control.

In one conventional process, for example, an emitter is formed by first fabricating a temporary emitter and depositing the spacers on the sidewalls of the temporary emitter. The extrinsic base region is then doped, with the temporary emitter and spacers forming a mask over the intrinsic and link base regions. After the temporary emitter is etched away, the final emitter is deposited in the cavity defined between the spacers.

It has been found, however, that the step of etching away the temporary emitter can be problematic in conventional processes. Specifically, conventional processes etch away the temporary emitter and expose the base-emitter junction through an opening defined in a patterned photoresist layer deposited over the temporary emitter. Desirably, the edges of the opening are registered over the spacers to ensure that photoresist cannot overlay any portion of the emitter. Due to the difficulty in flowing photoresist over the topography formed by the temporary emitter and spacers, as well as the rounded profiles of the spacers, proper registration of the opening can be difficult to obtain. Furthermore, as the feature widths of the emitter and spacers continue to decrease in successive technologies, proper registration of a patterned photoresist layer will become increasingly more difficult. The patterned photoresist layer covers and protects regions of a dielectric layer adjacent to the temporary emitter and spacers during the etching process that removes the temporary emitter.

Therefore, a substantial need exists in the art for an improved process for forming the emitter of a BiCMOS HBT structure, and desirably a process that eliminates the need for a photomask to etch away a temporary emitter used in the process and exposing the base-emitter junction underlying the same.

SUMMARY OF THE INVENTION

The invention addresses these and other problems associated with the prior art by providing a method of fabricating an HBT structure in a BiCMOS process in which an oxide layer overlying a base region is selectively thickened in areas that are not covered by a temporary emitter and spacers such that the temporary emitter can be removed and the base-emitter junction can be exposed without also completely removing the oxide overlying the areas of the base region that are not covered by the temporary emitter or spacers. As a result, no photomask is required to remove the temporary emitter and expose the base-emitter junction.

Consistent with one aspect of the invention, for example, a semiconductor device is fabricated by forming a base region on a substrate and overlying a collector defined in the substrate, forming an oxide layer over the base region, forming a temporary emitter over the base region and the oxide layer, and forming spacers alongside the temporary emitter. After forming the temporary emitter and spacers, oxide is grown on the oxide layer using an oxidation process where the oxidation rate (i.e., the rate of oxide growth) in the oxide layer in areas not covered by the temporary emitter and the spacers is greater than that in areas covered by the temporary emitter and the spacers. In regions covered by the temporary emitter and the spacers, the oxide growth may be minimal or negligible. The temporary emitter is removed after growing the oxide. The oxide layer is thinned, after removing the temporary emitter to expose a base-emitter junction defined on a top surface of the base region between the spacers. However, the oxide layer continues to overlay the base region in the areas not covered by the temporary emitter after the base-emitter junction is exposed. Thereafter, an emitter is formed over the exposed base-emitter junction and between the spacers.

Consistent with another aspect of the invention, a device structure comprises a collector region defined in the semiconductor material of a substrate, a base region on the collector region, spacers on a top surface of the base region, and an emitter on the top surface of the base region. The emitter intersects the base region between the spacers to define a base-emitter junction. The device structure further comprises an oxide layer on the top surface of the base region in areas other than the base-emitter junction. The oxide layer has a first region separating the spacers from the base and a second region. The oxide layer in the first and second regions has a different thickness.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

DETAILED DESCRIPTION

The embodiments described hereinafter eliminate the need for a photomask to remove a temporary emitter formed during the fabrication of an HBT structure in a BiCMOS process.

Instead, an oxide layer is deposited over a base region prior to formation of a temporary emitter and spacers, and is then thickened by an oxidation process, such as HIPOX, such that the oxide layer is selectively thickened at a higher rate in areas that are not covered by the temporary emitter and spacers. Consequently, the temporary emitter can be removed, and the oxide under the temporary layer can be removed to expose the base-emitter junction, without the use of a photomask. The oxide overlying the base region in the areas not covered by the temporary emitter and spacers is concurrently thinned during the removal of the temporary emitter and exposure of the base-emitter junction, but due to its comparatively greater thickness, is not completely removed during these operations.

Figure 1:
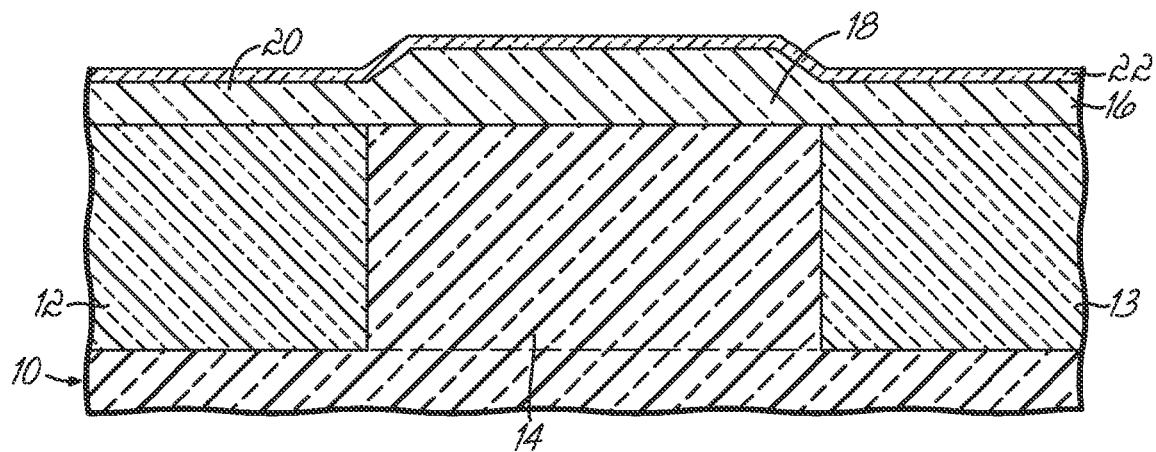
FIGS. 1-8 are diagrammatic cross-section views of a portion of a substrate at successive fabrication stages of a processing method in accordance with an embodiment of the invention.

Turning to the Drawings, wherein like numbers denote like parts throughout the several views, FIG. 1 illustrates, in cross-section, a substrate 10 including shallow trench isolation (STI) regions 12, 13 formed of a dielectric or an insulator, such as silicon dioxide, and a collector region 14 comprising silicon or another silicon-containing material flanked by the STI regions 12, 13. A base region 16 formed of silicon germanium, or optionally silicon or another suitable material, is grown over the STI and collector regions 12, 13, 14 by, for example, low temperature epitaxy (LTE). Due to the higher growth rate over silicon than oxide, the thickness of base region 16 over collector region 14 (identified at 18) is greater than the thickness of base region 16 over STI region 12 and 13 (identified at 20). An insulating layer 22, e.g., silicon dioxide, is grown or deposited over base region 16 to a thickness of, for example, about 10 nanometers to about 30 nanometers.

Figure 2:
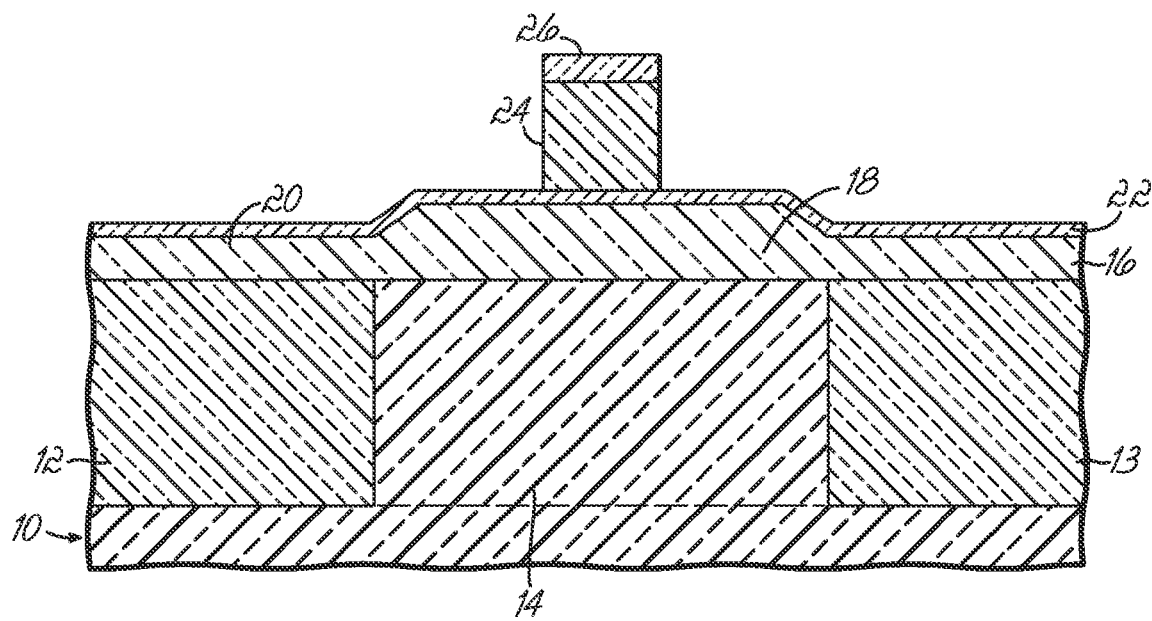

Next, turning to FIG. 2, a sacrificial temporary emitter 24 capped by dielectric cap 26 is formed on insulating layer 22 by depositing a layer stack consisting of a layer of a semiconductor material and a layer of a dielectric, such as silicon nitride. The semiconductor layer may comprise polycrystalline silicon (polysilicon) deposited using a known deposition process such as physical vapor deposition (PVD) or chemical vapor deposition (CVD) using a silicon source gas like silane (SiH$_4$). An anisotropic dry etching process, such as reactive-ion etching (RIE) or plasma etching, is then used to define a pedestal geometry for the sacrificial temporary emitter 24 and dielectric cap 26. The etching, which occurs through a patterned layer of photoresist, defines the width of the temporary emitter 24. The width of the temporary emitter 24 at this stage of the fabrication process substantially determines the width of the emitter in the final device structure. The width of the temporary emitter 24 may range from about 0.1 micron to about 10 microns contingent upon the application for the completed device structure.

Figure 3:
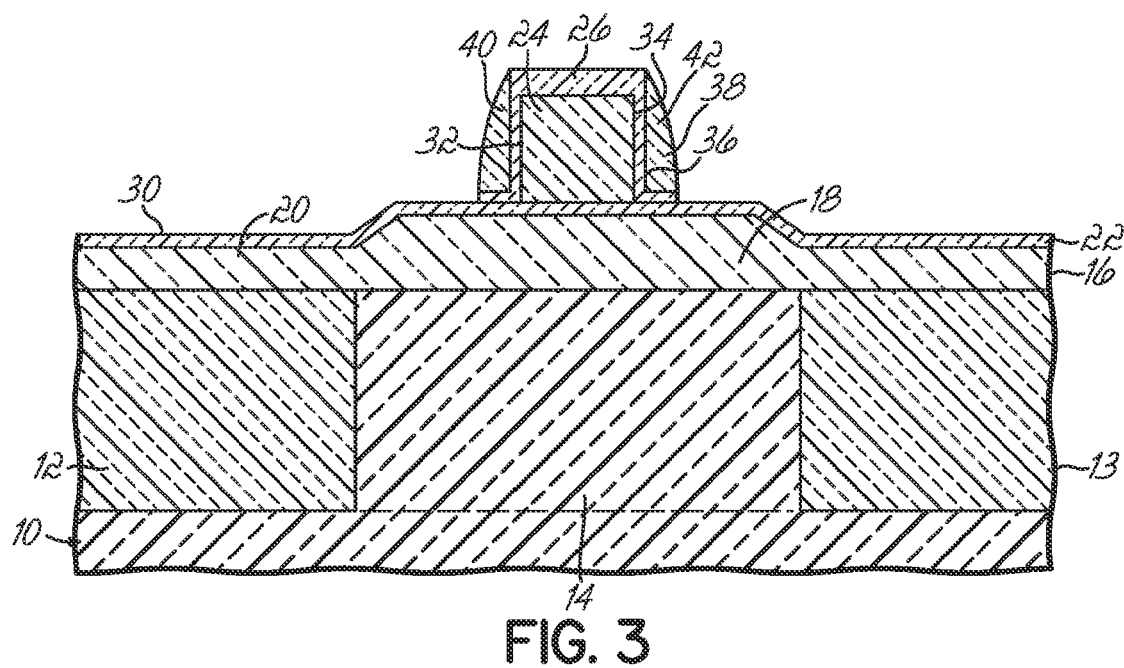

Next, turning to FIG. 3, composite spacers 40, 42 are formed on sidewalls 32, 34 of the temporary emitter 24. Each of the spacers 40, 42 includes an L-shaped inner portion 36 and an outer portion 38 joined by a cap on top of the dielectric cap 26. The spacers 40, 42 may comprise composite silicon nitride/silicon dioxide structures formed by depositing a first layer of a insulating material, such as silicon nitride deposited by a CVD process, on the surface 30 of insulating layer 22, then depositing a second layer of a different insulating material, such as silicon dioxide, over the first layer, and then using an anisotropic etching process to shape the composite spacers 40, 42.

Figure 4:
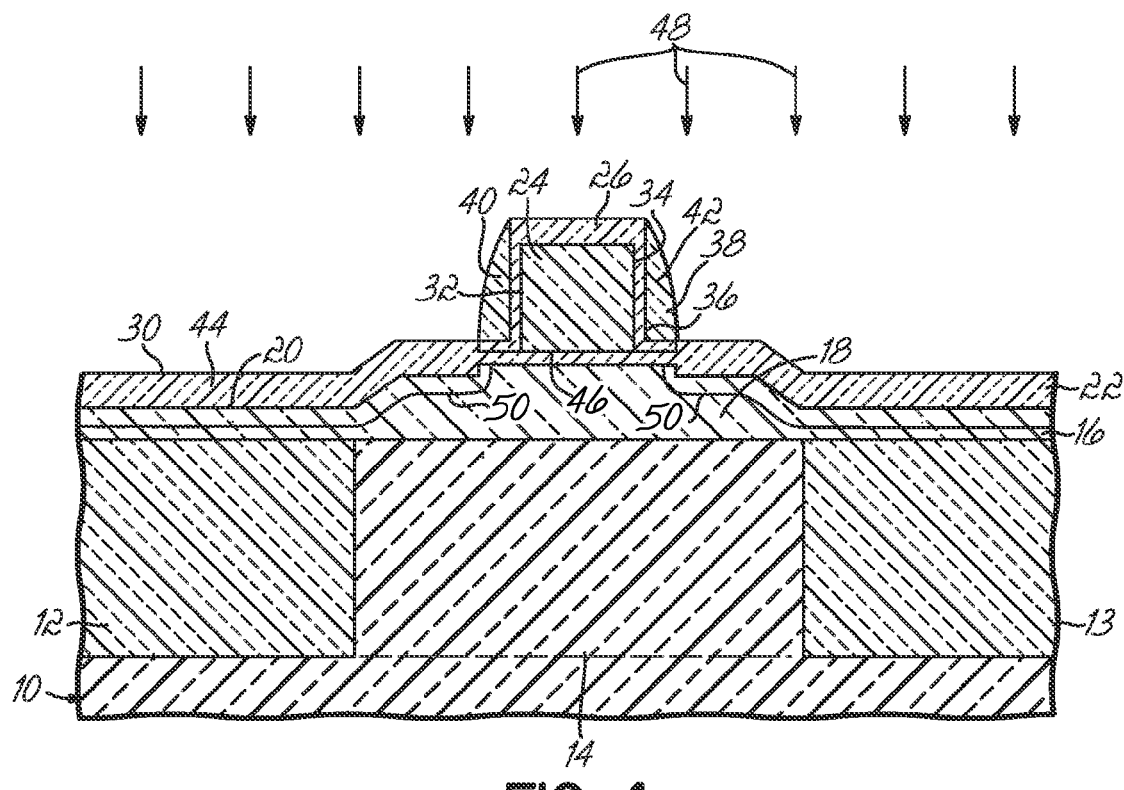

Next, turning to FIG. 4, a process step is performed to thicken insulating layer 22. For example, a high pressure, low temperature oxidation (HIPOX) process may be used to thicken silicon dioxide forming layer 22. In one embodiment, for example, the HIPOX oxidation is conducted in a high-pressure atmosphere consisting of about 5 atmospheres to about 30 atmospheres of oxygen with a trace amount of water vapor, and at about 500° C. to about 800° C. Because of the presence of the structure comprising temporary emitter 24 and spacers 40, 42, however, the rate of oxide growth in insulating layer 22 is greater in the area that is uncovered by the structure (identified at 44) than is covered by the structure (identified at 46). In one embodiment, silicon dioxide layer 22, after HIPOX, may be greater than about 40 nanometers outside of temporary emitter 24 and composite spacers 40, 42. In another embodiment, silicon dioxide layer 22, after HIPOX, may be greater than about 30 nanometers outside of temporary emitter 24 and composite spacers 40, 42. The thickness in region 44 after thickening may be more than twice the original thickness.

Other oxidation processes understood by a person having ordinary skill in the art may be used to thicken insulating layer 22. The use of a low temperature oxidation process such as HIPOX, however, has been found to be compatible with technologies, such as silicon germanium (SiGe) technologies, that may be incompatible with higher temperature oxidation processes.

Next, a self-aligned extrinsic base implant is performed, as illustrated by arrows 48, to form heavily doped extrinsic base regions 50. In other embodiments, the base implant can be performed before oxidation to thicken silicon dioxide layer 22.

Figure 5:
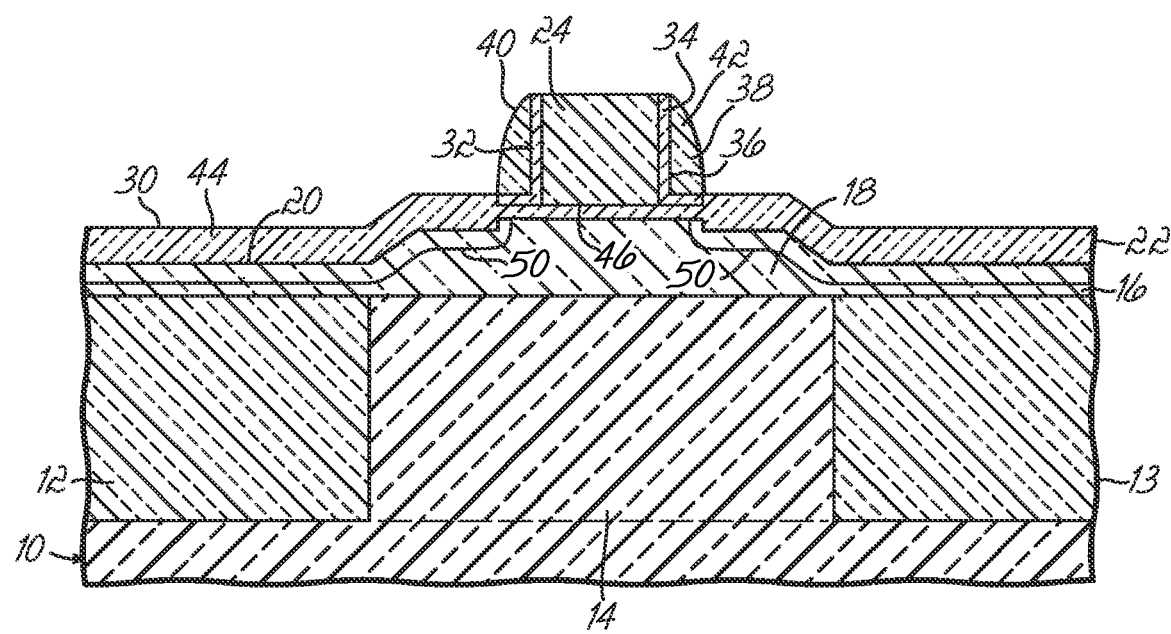
Figure 6:
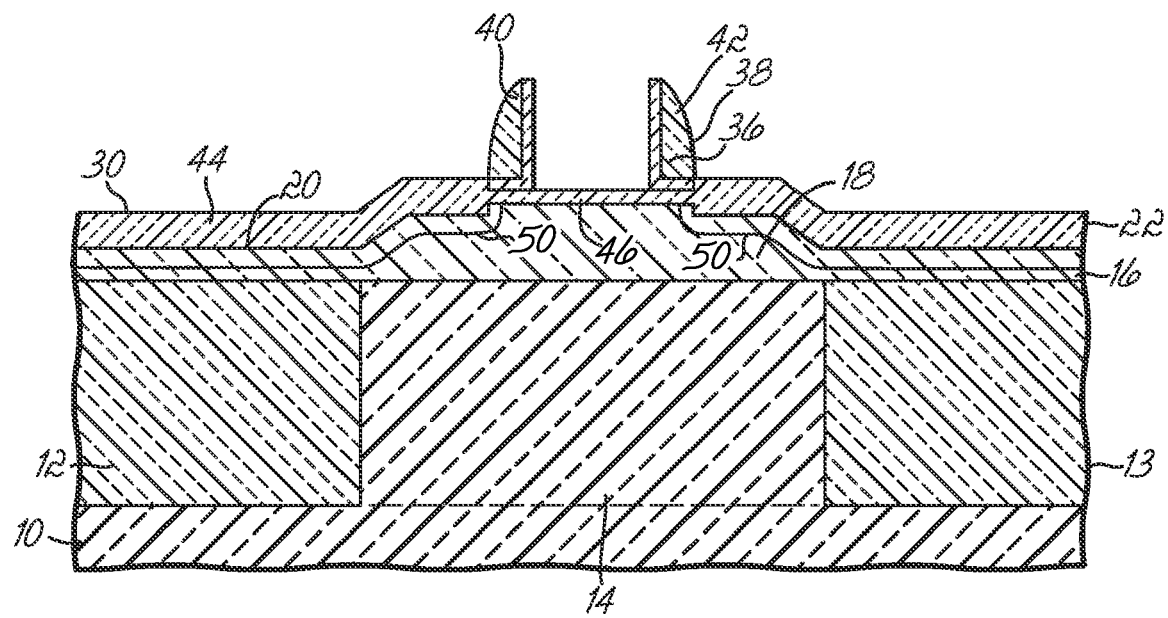

Next, turning to FIG. 5, the cap 28 is selectively removed from the temporary emitter 24 by, for example, an oxynitride strip required if the oxidation process thickening the insulating layer 22 modifies the stoichiometry of the cap 28. Then, as shown in FIG. 6, the temporary emitter 24 is removed via, for example, a selective RIE process. In addition, an optional step of depositing and etching a layer of a dielectric material, such as silicon nitride, inside the cavity defined by composite spacers 40, 42 to thicken the inner portion 36 of each may also be performed after the temporary emitter 24 has been removed.

Figure 7:
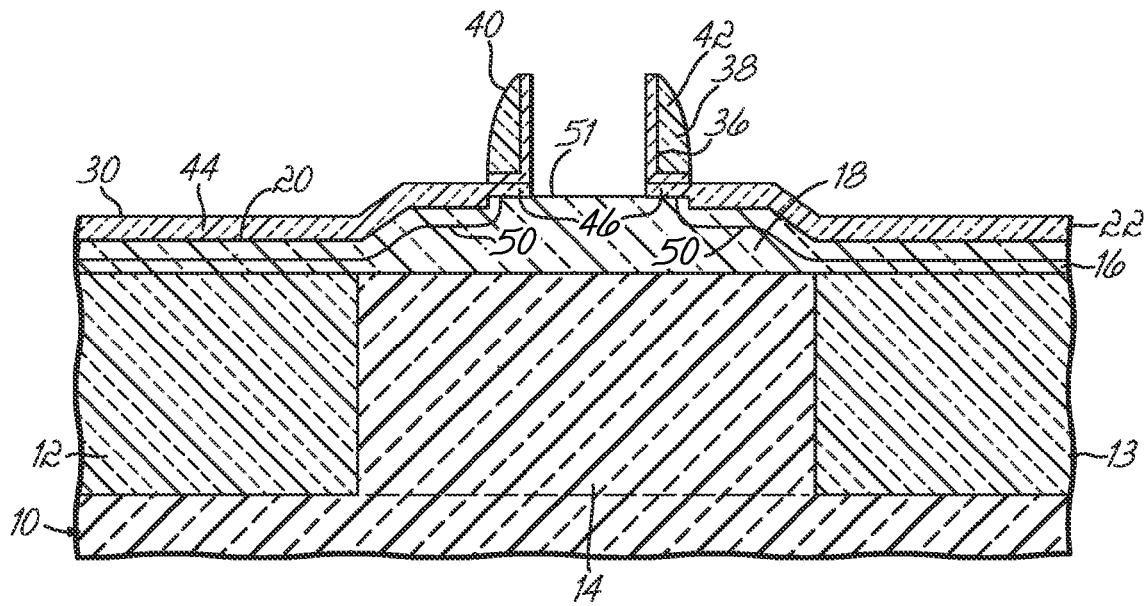
Figure 8:
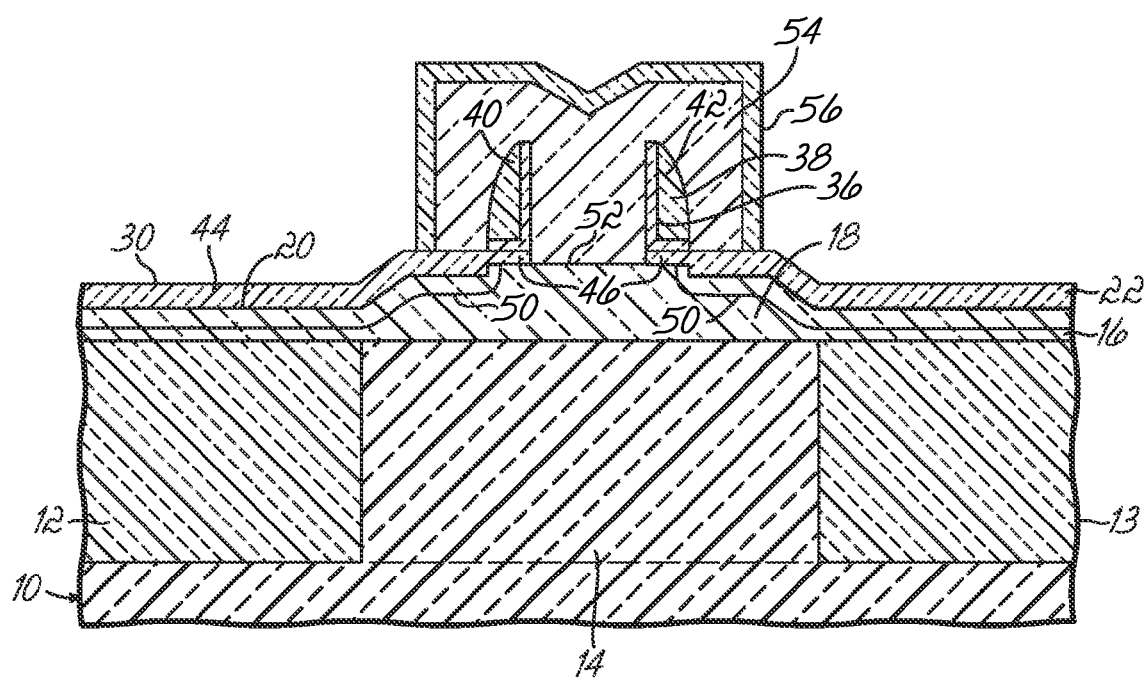

Next, turning to FIG. 7, the insulating layer 22 in area 46 (FIG. 4) between the composite spacers 40, 42 is removed to expose a portion of the top surface 51 of the base region 16 that will subsequently define a base-emitter junction 52 (FIG. 8). The dielectric material constituting insulating layer 22 may be selectively removed relative to the semiconductor material of the base region 16 by a dry chemical oxide removal (COR) process or using dilute hydrofluoric acid (DHF). Of note, however, no photomask is required or used in this process step; dielectric material is also removed from region 44, but by virtue of the comparatively greater thickness of region 44 formed during HIPOX, insulating material remains in this region 44 and, therefore, continues to overlay the base region 16 even after the prospective location of the base-emitter junction 52 is exposed between spacers 40, 42.

Next, turning to FIG. 8, an emitter 54 is formed that contacts the top surface 51 to define the base-emitter junction 52. The emitter 54 may originate from a layer of a semiconductor material, such as polysilicon, deposited by, for example, a CVD process and doped in situ during deposition, and shaped using a conventional photolithography and etching process. The emitter 54 may take the form of a T-shaped structure that extends over and envelopes each composite spacer 40, 42. Of note, the formation of emitter 54 may be performed using a photomask, but given the emitter width is controlled by the separation of the composite spacers 40, 42, and that layer 22 extends under spacers 40, 42 and over the extrinsic base portion of base region 16, the width and registration of the opening in the photomask required to form the emitter is not as critical. In addition, as is also shown in FIG. 8, it may be desirable to optionally deposit an emitter-cap layer and spacer 56 of, for example, silicon nitride over emitter 54. Furthermore, by virtue of the dielectric material of the insulating layer 22 from region 44 remaining under each spacer 40, 42 and the remaining part of the insulating layer 22 in region 46, sufficient isolation is still provided between the emitter 54 and the base region 16.

In the final device structure, thickness of insulating layer 22 under the composite spacers 40, 42 differs from the thickness of insulating layer 22 outside the spacers 40, 42, but underneath the T-shaped emitter 54. Etching thins the insulating layer 22 in region 46, but does not thin the insulating layer 22 in region 44 beneath the spacers. Generally, this gives rise to the difference in post-etching thickness. In one embodiment, the insulating layer 22 in region 44 has a greater thickness than in region 46 beneath the spacers 40, 42.

Fabrication of a completed HBT device from the structure illustrated in FIG. 8 continues in a conventional manner, including the formation of contacts and back-end-of-line (BEOL) processing to form interconnects. Formation of the HBT device is then complete.

Of note, the herein described process self-aligns the emitter to the extrinsic base region, and does so in a manner that eliminates the need for a photomask to remove the temporary emitter and expose the base-emitter junction. As a result, the process is simplified and less costly than conventional processes, and has an improved process window in comparison to conventional processes.

References herein to terms such as "vertical", "horizontal", etc. are made by way of example, and not by way of limitation, to establish a frame of reference. The term "horizontal" as used herein is defined as a plane parallel to a conventional plane of a semiconductor wafer or substrate, regardless of its actual three-dimensional spatial orientation. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the invention without departing from the spirit and scope of the invention. The term "on" used in the context of two layers means at least some contact between the layers. The term "over" means two layers that are in close proximity, but possibly with one or more additional intervening layers such that contact is possible, but not required. As used herein, neither "on" nor "over" implies any directionality.

The fabrication of the device structure herein has been described by a specific order of fabrication stages and steps. However, it is understood that the order may differ from that described. For example, the order of two or more fabrication steps may be switched relative to the order shown. Moreover, two or more fabrication steps may be conducted either concurrently or with partial concurrence. In addition, various fabrication steps may be omitted and other fabrication steps may be added. It is understood that all such variations are within the scope of the invention. It is also understood that features of the invention are not necessarily shown to scale in the drawings.

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method of fabricating a semiconductor device, the method comprising:
    forming a base region on a substrate and overlying a collector defined in the substrate;
    forming an oxide layer over the base region;
    forming a temporary emitter over the base region and the oxide layer;
    forming spacers on the sidewalls of the temporary emitter;
    after forming the temporary emitter and spacers, thickening the oxide layer using an oxidation process wherein a growth rate in the oxide layer in areas not covered by the temporary emitter and the spacers is greater than that in areas covered by the temporary emitter and the spacers;
    removing the temporary emitter after growing the oxide;
    thinning the oxide layer, after removing the temporary emitter, to expose a base-emitter junction on a top surface of the base region and between the spacers, wherein the oxide layer continues to overlay the base region in the areas not covered by the temporary emitter after the base-emitter junction is exposed; and
    forming an emitter over the exposed base-emitter junction and between the spacers.

2. The method of claim 1, wherein forming the emitter comprises:
    forming a T-shaped emitter that envelops the spacers.

3. The method of claim 1, further comprising:
    doping the base region after forming the temporary emitter and spacers to form an extrinsic base region.

4. The method of claim 1, wherein growing the oxide is performed using a high pressure, low temperature oxidation (HIPOX) process.

5. The method of claim 1, wherein removing the temporary emitter is performed without using a photomask.

6. The method of claim 1, wherein thinning the oxide layer is performed without using a photomask.

7. The method of claim 1, wherein the device comprises a heterojunction bipolar transistor (HBT).

8. The method of claim 1, wherein the method is performed within a BiCMOS process.

* * * * *